United States Patent

Nix et al.

(10) Patent No.: US 8,410,833 B2
(45) Date of Patent: Apr. 2, 2013

(54) ON-CHIP POWER-UP CONTROL CIRCUIT

(75) Inventors: Michael A. Nix, Austin, TX (US);
Golam R. Chowdhury, Austin, TX (US); Curtis M. Brody, Austin, TX (US); Faisal A. Syed, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 76 days.

(21) Appl. No.: 13/076,071

(22) Filed: Mar. 30, 2011

(65) Prior Publication Data

US 2012/0218012 A1   Aug. 30, 2012

Related U.S. Application Data

(60) Provisional application No. 61/447,326, filed on Feb. 28, 2011.

(51) Int. Cl.
*H03L 7/00* (2006.01)
(52) U.S. Cl. .......................... 327/143; 327/198
(58) Field of Classification Search .............. 327/142, 327/143, 198
See application file for complete search history.

(56) References Cited

U.S. PATENT DOCUMENTS

| | | | | |
|---|---|---|---|---|
| 3,599,016 A | * | 8/1971 | Leightner | 327/36 |
| 3,950,654 A | * | 4/1976 | Broedner et al. | 327/143 |
| 4,196,362 A | * | 4/1980 | Maehashi | 327/77 |
| 4,736,119 A | * | 4/1988 | Chen et al. | 327/143 |
| 5,414,307 A | * | 5/1995 | Brandmaier | 327/143 |
| 6,085,327 A | * | 7/2000 | Seng et al. | 713/300 |
| 6,173,436 B1 | * | 1/2001 | Ciccone et al. | 716/55 |
| 7,057,427 B2 | * | 6/2006 | Wadhwa et al. | 327/143 |
| 7,876,135 B2 | | 1/2011 | Shkidt | |
| 2009/0256541 A1 | | 10/2009 | Akyildiz et al. | |

* cited by examiner

*Primary Examiner* — Lincoln Donovan
*Assistant Examiner* — William Hernandez
(74) *Attorney, Agent, or Firm* — Zagorin O'Brien Graham LLP

(57) ABSTRACT

A power-up control circuit utilizes on-chip circuits, multiple voltages, a ring oscillator and counter, and edge and level detection circuits to guarantee reset during power-up conditions and continues the reset state with a variable length counter to guarantee a predictable reset. In addition, a clean start-up after a logical power-down condition is provided.

19 Claims, 4 Drawing Sheets

ON-CHIP POWER-UP CONTROL CIRCUIT

CROSS-REFERENCE TO RELATED APPLICATION(S)

This application claims the benefit of U.S. provisional application No. 61/447,326, filed Feb. 28, 2011, entitled "On-Chip Power-Up Control Circuit," naming inventors Michael A. Nix, Golam R. Chowdhury, Curt Brody and Faisal A. Syed, which application is incorporated by reference herein in its entirety.

BACKGROUND

1. Field of the Invention

This invention relates to power-up control for integrated circuits and more particularly for power-up control for digital logic.

2. Description of the Related Art

At power up, while the power supply is ramping, the states of the sequential digital circuits, such as latches, registers, and flip-flops, may get stuck to some arbitrary logic levels. Thus, there is a need to force the latches, registers, and flip-flops into a known state using a reset signal. After the power supply reaches a known state by asserting the reset signal for a period of time, the sequential digital circuits enter a known state, and the reset is released. Many existing solutions use external resistor capacitor (R-C) components to achieve suitable delay to allow the reset signal to reset the digital logic, thus requiring additional dedicated pins to provide sufficient delay to ensure the sequential digital circuits have been reset with an appropriate power supply level. An on-chip R-C based delay circuit is not a practical solution due to the fact that the power supply may have a very slow ramp requiring a large on-chip silicon area to afford a sufficiently large R-C circuit. Accordingly, improvement in power-up control is desirable.

SUMMARY Of EMBODIMENTS Of The INVENTION

In an embodiment, a power-up control circuit is provided that includes a voltage detect circuit coupled to a first power supply, the voltage detect circuit to provide a detect signal indicating a ramp of the first power supply. A delay circuit is coupled to the voltage detect circuit to provide a delayed detect signal that is a delayed version of the detect signal and is coupled to a second power supply voltage. A counter circuit is coupled to a ring oscillator circuit and the delay circuit and provides a reset signal that is released on reaching a specified count value.

In another embodiment, a method is provided that includes providing a detect signal responsive to ramp of a first power supply voltage. The detect signal is delayed in a delay circuit to generate a delayed detect signal. The delayed detect signal is latched in a latch circuit and a counter circuit is enabled to count based on an output of the latch circuit. The counter circuit counts for a count value and thereafter asserts a reset signal that is released on reaching the count value.

DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

According to an embodiment, an on-chip ring oscillator, and edge and level detection circuits that generate signals for reset control during power up that extend the reset state using a variable length counter to guarantee a predictable reset. In addition, one or more embodiments provide a clean start-up after a logical power-down condition.

Figure 1:
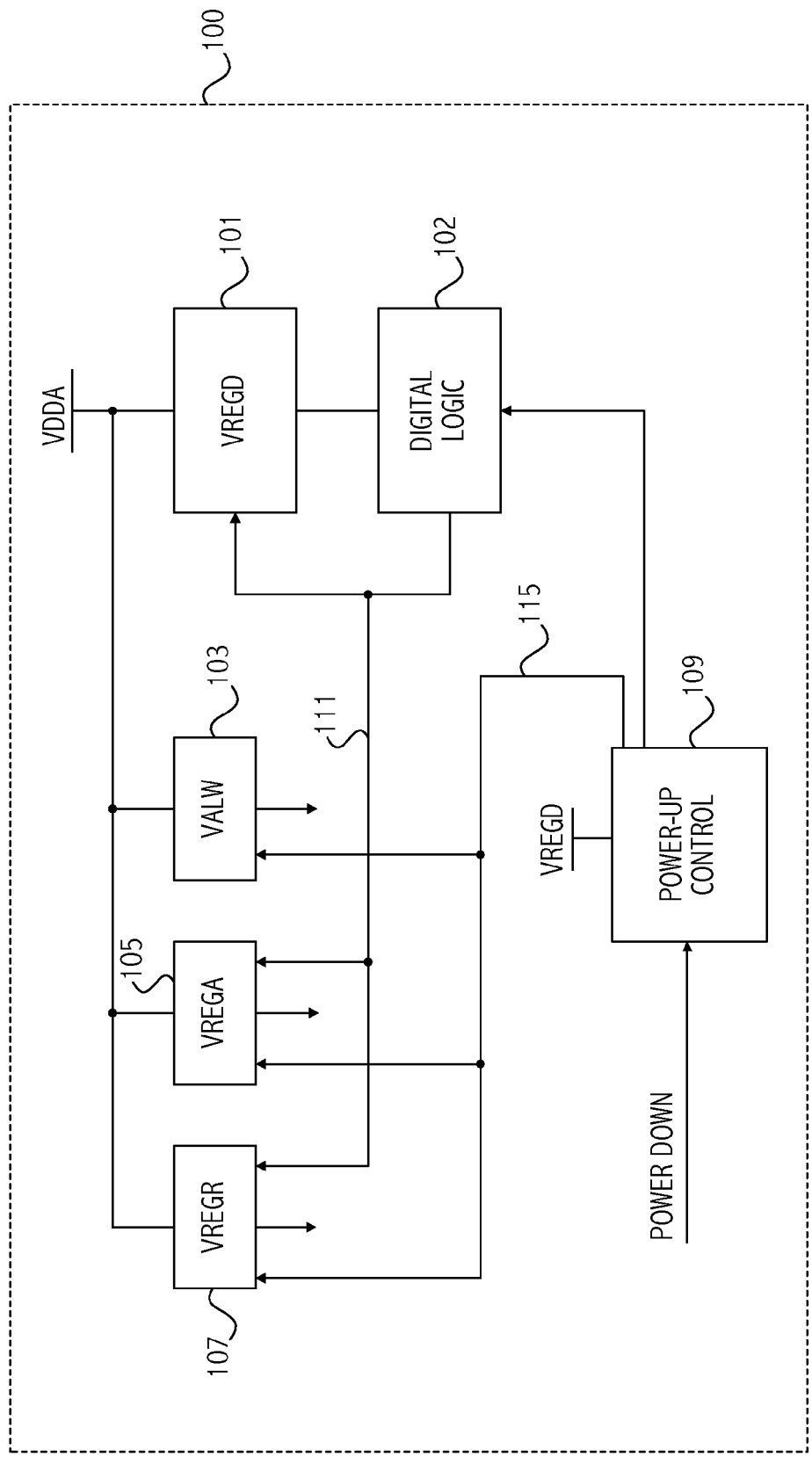
FIG. 1 illustrates various voltage regulators used in an integrated circuit according to an embodiment.
Figure 2:
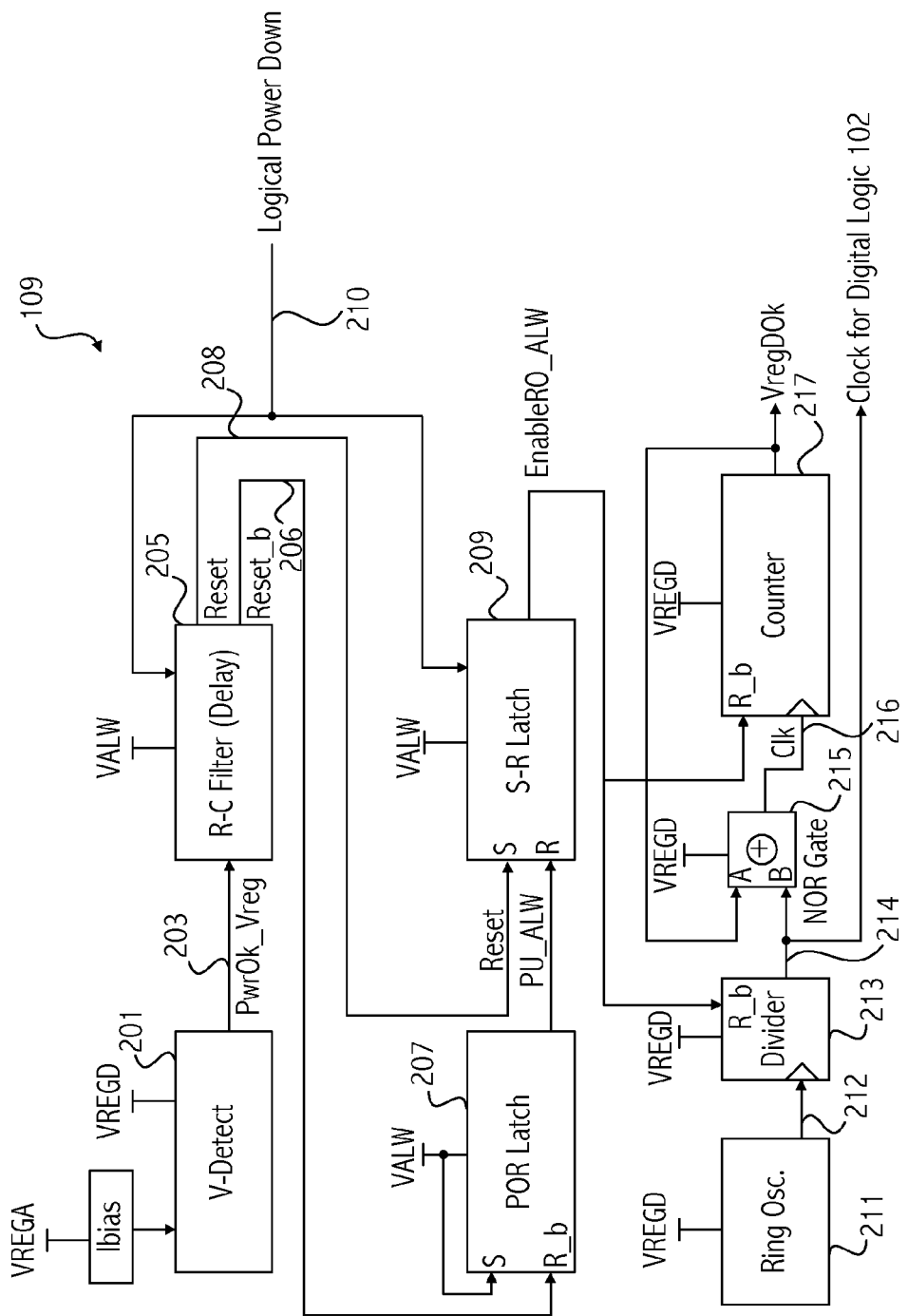
FIG. 2 illustrates a block diagram of an embodiment of a power-up controller.

Referring to FIG. 1, an embodiment includes an integrated circuit 100 having multiple power supplies. In the illustrated embodiment, one power supply voltage VDDA is used to generate a number of other regulated voltages, including VREGD 101 for digital logic 102, VALW 103, a voltage that is always on, e.g., for input/output regions of an integrated circuit, VREGA 105 for analog circuitry, and reference voltage VREGR 107. Other embodiments may have additional or fewer regulated voltages being generated for a variety of purposes. The power-up control circuit 109, which is supplied with multiple ones of the regulated voltages as shown in FIG. 2, controls the power up of the digital logic 102 to ensure it is in a known state when the reset signal is deasserted. The digital logic may include, e.g., substantial portions of the logic of a microprocessor. Note that in the illustrated embodiment, the digital logic 102 supplies control attributes 111 to the voltage regulators. In an embodiment, the attributes are kept at a default state until a signal 115 is received from the power-up control circuit 109 indicating that the digital logic is good and therefore the attributes are reliable.

Figure 3A:
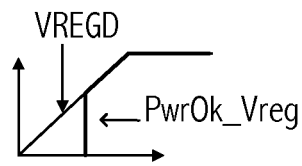
FIGS. 3a through 3d illustrate various waveforms associated with the block diagram of FIG. 2.

Referring to FIG. 2, a power-up control circuit 109 is shown. Voltage detect circuit 201 produces a pulse with a rising edge, PwrOK_Vreg 203, in response to the ramp of its power supply VREGD. As described above, VREGD is the power supply voltage for the digital logic 102. The voltage detect circuit 201 first generates a ramping voltage using a bias current and a resistor. FIG. 3a illustrates waveforms associated with the generation of the PwrOK_Vreg signal with relation to the ramping of the VREGD signal. The bias current may be generated by a ramping power supply other than VREG and is replicated using the VREGD supply.

Figure 3B:
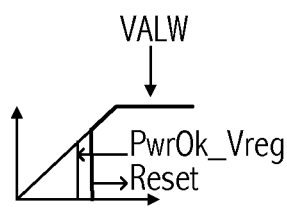

The PwrOK_Vreg signal is delayed using an on-chip R-C delay circuit 205. The delayed PwrOK_Vreg signal is used to control the POR_latch 207 and S-R latch 209. The delay circuit 205 generates a Reset signal 208 and a Reset_b signal 206, which is an inverted version of the Reset signal 208. FIG. 3b illustrates the generation of the Reset signal 208 after a delay from the PwrOK_Vreg signal.

Figure 3C:
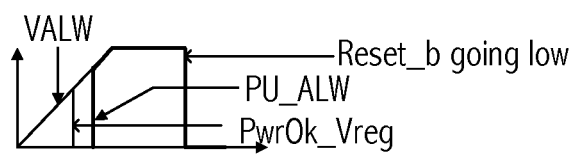

In an embodiment, the POR-latch is an analog S-R type latch. The POR_latch 207 has its set input (S) coupled to the voltage supply VALW. POR_latch 207 produces a ramping pulse, PU_ALW, in response to the ramping of its power supply, VALW. The width of the pulse PU_ALW is controlled by (Reset_b) 206, which is a delayed version of the PwrOK_Vreg signal. Assertion of the delayed PwrOK_Vreg as indicated by Reset_b signal 206 being asserted (low) causes the POR_latch 207 to be reset. FIG. 3c illustrates the pulse PU_ALW. Resetting the POR latch, which supplies the reset input of the S-R latch 209, allows the Reset signal 208 to set the S-R latch 209.

Figure 3D:
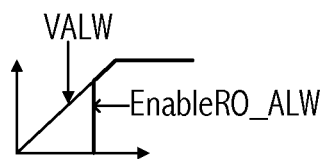

The on-chip ring oscillator 211 generates the clock signal 212 and is coupled to receive its supply voltage from the power supply VREGD. The S-R digital latch produces the EnableRO_ALW signal, which resets ring oscillator divider 213 and the counter 217 while the EnableRO_ALW signal is deasserted. Assertion of the EnableRO_ALW signal allows the ring oscillator to provide clocks through the divider 213 to the counter 217. The EnableRO_ALW signal asserts when the S-R latch 209 is set by the assertion of the Reset signal 208 caused by assertion of the delayed PwrOK_Vreg signal. FIG. 3d illustrates generation of EnableRO_ALW. When EnableRO_ALW signal is deasserted, the signal VregDOk is held low. VregDOk functions as a reset signal (active low) for the digital logic. Once the reset on the divider 213 is no longer active, the divider 213 generates a clock signal 214 used by the digital circuit 102 (see FIG. 1). The clock signal 214 is also supplied to NOR gate 215, which in turn supplies the clock signal 216 for counter 217.

The counter 217 can be designed to divide the clock signal 216, supplied through NOR gate 215, by any number, typically a multiple of 2. The number or count value corresponds to a desired delay based on the frequency of clock signal 216 and the count value. After counting the desired number, counter 217 deasserts the VregDOk signal indicating that the power supply VREGD has risen to a level where all digital circuits can operate properly and have been reset, and thus are in a known condition and the reset is released. The VregDOk signal is provided as an active low reset signal to the digital logic. Thus, while VregDOk is asserted (low) and the clock signal 214 is providing clocks, the digital logic is reset. After the VregDOk signal is deasserted (goes high), indicating the end of reset, the clock to the counter 217 is disabled by NOR gate 215, thus saving power. While the counter can be of any length according to the needs of the system, in one embodiment it is implemented as a 6-bit ripple counter. The specified count value corresponding to the desired delay can be hardwired or programmable.

Note that when EnableRO_ALW is low (deasserted) the VregDOk signal remains low. The VregDOk signal is kept low (and thus reset continues) for the additional length of time the counter counts, and then it is asserted releasing the reset of the digital block. Thus, following deassertion of VregDOk at the expiration of the count, the digital block is reset to a known state.

The power-up control circuit also provides a clean startup after a logical power-down, e.g., to a power savings state. When a logical power-down signal 210 is asserted, the Reset signal 208 generated by the R-C delay block 205 is brought to low, EnableRO_ALW goes low immediately, which brings VregDOk to low, and the digital logic is reset. Logical power down also causes the power supplies VregA, VregD, and VregR to be disabled. When the logical power-down signal 210 is deasserted, EnableRO_ALW goes high after the R-C delay, and VregDOk goes high after the length of the counter, and releasing the reset of the digital block.

Note that the embodiment illustrated in FIG. 2 uses all on-chip circuits. Further, the power supply VREGD defines the duration of reset for the digital circuits. The duration of the reset is further extended by the on-chip R-C delay and also by the length of the divider 213 counting of the ring oscillator output and of course the counter. The use of latches, the ring oscillator, and the counter allows the R-C delay to account for a much smaller delay and thus use of a small R-C delay circuit, thereby avoiding the need for an external capacitor.

The delays guarantee that the supply VREGD has arrived at a level for a sufficient period of time to ensure the digital circuits work properly with a known initial state.

Figure 4:
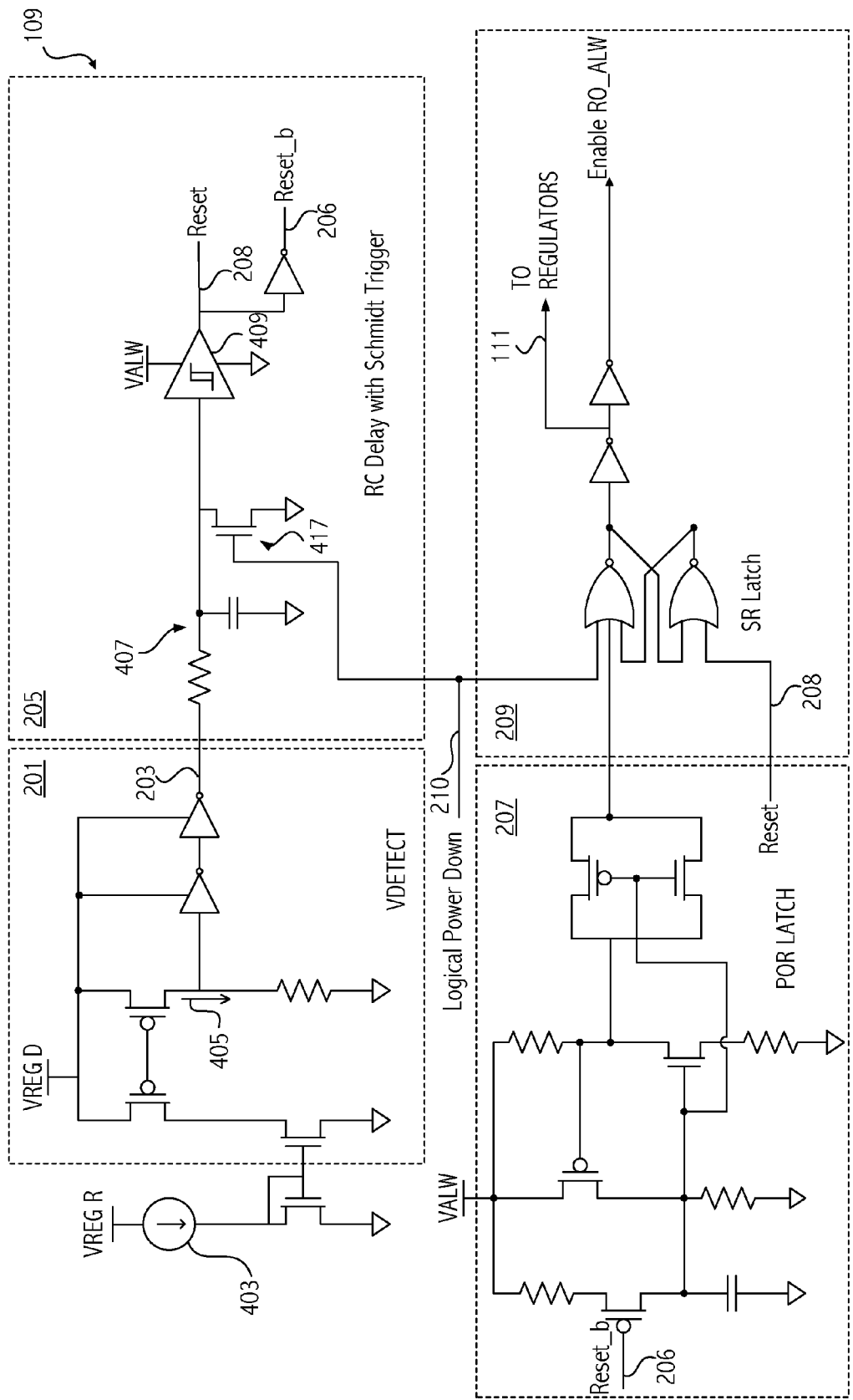
FIG. 4 illustrates additional details of a power-up control circuit according to an embodiment.

Referring to FIG. 4, additional details of an embodiment of the power-up control block 109 are illustrated. The V-detect circuit 201 first generates a ramping voltage using a bias current and a resistor. The bias current is supplied by current source 403 utilizing the ramping power supply VREGR and is replicated as current 405 using the VREGD supply.

Additional details of the delay block 205 are shown in FIG. 4. The R-C circuit 407 provides the delay. In the illustrated embodiment a Schmidt trigger circuit 409 is utilized to generate the Reset signal 208 and the Reset_b signal on 206 after an inversion. The POR latch 207 is shown in more detail in FIG. 4 as well as the S-R latch 209. When the logical power-down signal 210 is asserted, the Reset signal is reset through transistor 417. In addition, the EnableRO_ALW is reset to 0, resetting the divider 213 and the counter 217 as described earlier.

The embodiments described tolerate varying supply rise times for different power supplies like VREGD, VALW as well as providing a clean start after a logical power down is deasserted.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example the polarity of the signals described may be changed in other embodiments. Other variations and modifications of the embodiments disclosed herein, may be made based on the description set forth herein, without departing from the scope and spirit of the invention as set forth in the following claims.

What is claimed is:

1. A power-up control circuit comprising:
   a voltage detect circuit coupled to a first power supply, the voltage detect circuit to provide a detect signal indicating a ramp of the first power supply;
   a delay circuit coupled to the voltage detect circuit to provide a delayed detect signal that is a delayed version of the detect signal, the delay circuit coupled to a second power supply voltage;
   a ring oscillator circuit; and
   a counter circuit coupled to the ring oscillator circuit and the delay circuit to provide a reset signal that is released on reaching a specified count value.

2. The power-up control circuit as recited in claim 1 further comprising a divider circuit coupled to receive an output of the ring oscillator circuit and coupled to supply a clock signal to the counter circuit.

3. The power-up control circuit as recited in claim 2 further comprising:

a first latch circuit coupled to the delay circuit, and
wherein the divider circuit and the counter circuit are coupled to be reset by an output of the first latch circuit until assertion of the delayed detect signal causes the output of the latch circuit to be asserted.

4. The power-up control circuit as recited in claim 3 further comprising a second latch circuit coupled between the delay circuit and the first latch circuit and coupled to a second power supply, the second latch circuit to supply a reset input of the first latch circuit and wherein the delayed detect signal is coupled to a set input of the first latch circuit.

5. The power-up control circuit as recited in claim 4 wherein the first and second latch circuits are supplied with the second supply voltage.

6. The power-up control circuit as recited in claim 1 further comprising a logic circuit coupled to receive a divider output signal and the reset signal, and to supply a clock input of the counter circuit, wherein deassertion of the reset signal, indicating reset is complete, causes the clock signal being supplied to the counter to be stopped.

7. The power-up control circuit as recited in claim 1 further comprising a current source coupled to a third power supply voltage, the current source to supply a current to the voltage detect circuit.

8. The power-up control circuit as recited in claim 3 wherein the delay circuit is coupled to receive a logical power-down signal to cause the delayed detect signal to be deasserted responsive to assertion of the logical power-down signal.

9. The power-up control circuit as recited in claim 8 wherein the first latch is coupled to receive the logical power-down signal and to assert a disable signal to maintain the divider circuit and the counter circuit in a reset state while the logical power-down signal is asserted.

10. A method comprising:
providing a detect signal responsive to ramp of a first power supply voltage;
delaying the detect signal in a delay circuit and supplying a delayed detect signal;
latching the delayed detect signal in a latch circuit;
enabling a counter circuit to count based on an output of the latch circuit;
providing from the counter circuit an asserted reset signal; and
counting in the counter circuit for a count value and thereafter deasserting the reset signal on reaching the count value.

11. The method as recited in claim 10 further comprising dividing an output of a ring oscillator circuit in a divider circuit and supplying an output of the divider circuit as a clock signal to clock the counter circuit.

12. The method as recited in claim 11 further comprising resetting the divider circuit and the latch circuit until the delayed detect signal is asserted.

13. The method as recited in claim 12 further comprising:
supplying a reset input of the latch circuit from a second latch circuit, supplying the delayed detect signal to a set input of the first latch circuit, and supplying a set input of the second latch circuit from a second power supply voltage node.

14. The method as recited in claim 13 further comprising supplying the first and second latch circuits with the second power supply voltage.

15. The method as recited in claim 11 further comprising stopping the clock signal in response to deassertion of the reset signal.

16. The method as recited in claim 11 further supplying the clock signal to digital logic being reset while the counter is counting and providing the asserted reset signal.

17. The method as recited in claim 11 further comprising resetting the delayed detect signal in the delay circuit in response to assertion of a logical power-down signal.

18. The method as recited in claim 17 further comprising asserting a disable signal to maintain the divider circuit and the counter circuit in a reset state while the logical power-down signal is asserted.

19. A non-transitory tangible computer-readable medium encoding a representation of an integrated circuit that comprises:
a voltage detect circuit coupled to a first power supply, the voltage detect circuit to provide a detect signal indicative of a ramp of the first power supply;
a delay circuit coupled to the voltage detect circuit to provide a delayed detect signal that is a delayed version of the detect circuit, the delay circuit coupled to a second power supply voltage;
a ring oscillator circuit; and
a counter circuit coupled to the ring oscillator circuit and the delay circuit to provide a reset signal that is released upon counting a count value.

* * * * *

UNITED STATES PATENT AND TRADEMARK OFFICE
CERTIFICATE OF CORRECTION

| | | |
|---|---|---|
| PATENT NO. | : 8,410,833 B2 | Page 1 of 1 |
| APPLICATION NO. | : 13/076071 | |
| DATED | : April 2, 2013 | |
| INVENTOR(S) | : Michael A. Nix et al. | |

It is certified that error appears in the above-identified patent and that said Letters Patent is hereby corrected as shown below:

In the Claims:

In column 5, line 36, please insert --a-- after "to".

Signed and Sealed this
Twenty-first Day of May, 2013

Teresa Stanek Rea
*Acting Director of the United States Patent and Trademark Office*